United States Patent
Kunimune

(10) Patent No.: US 10,875,127 B2
(45) Date of Patent: Dec. 29, 2020

(54) METHOD FOR BONDING ELECTRONIC COMPONENT AND METHOD FOR MANUFACTURING BONDED BODY

(71) Applicant: Nichia Corporation, Anan (JP)

(72) Inventor: Teppei Kunimune, Tokushima (JP)

(73) Assignee: NICHIA CORPORATION, Anan (JP)

( * ) Notice: Subject to any disclaimer, the term of this patent is extended or adjusted under 35 U.S.C. 154(b) by 118 days.

(21) Appl. No.: 16/136,816

(22) Filed: Sep. 20, 2018

(65) Prior Publication Data
US 2019/0091808 A1 Mar. 28, 2019

(30) Foreign Application Priority Data
Sep. 22, 2017 (JP) ................. 2017-182141

(51) Int. Cl.
*H01L 23/00* (2006.01)
*B23K 35/02* (2006.01)
(Continued)

(52) U.S. Cl.
CPC ........ *B23K 35/025* (2013.01); *B23K 35/3006* (2013.01); *H01L 24/04* (2013.01); *H01L 24/27* (2013.01); *H01L 24/29* (2013.01); *H01L 24/83* (2013.01); *H05K 3/3463* (2013.01); *B23K 35/0244* (2013.01); *B23K 35/3612* (2013.01); *B23K 35/38* (2013.01); *H01L 2224/29139* (2013.01); *H01L 2224/32225* (2013.01); *H01L 2224/32245* (2013.01); *H01L 2224/83055* (2013.01); *H01L 2224/83065* (2013.01); *H01L 2224/83075* (2013.01); *H01L 2224/8384* (2013.01); *H01L 2224/83192* (2013.01); *H01L 2924/3512* (2013.01); *H05K 3/32* (2013.01); *H05K 2203/1131* (2013.01)

(58) Field of Classification Search
CPC ....................................................... H01L 24/83
See application file for complete search history.

(56) References Cited

U.S. PATENT DOCUMENTS

2011/0012262 A1 1/2011 Morita et al.
2011/0290863 A1 12/2011 Kajiwara et al.
(Continued)

FOREIGN PATENT DOCUMENTS

EP 3 348 337 A1 7/2018
JP 2005-267900 A 9/2005
(Continued)

*Primary Examiner* — Moazzam Hossain
*Assistant Examiner* — Hajar Kolahdouzan
(74) *Attorney, Agent, or Firm* — Birch, Stewart, Kolasch & Birch, LLP

(57) ABSTRACT

The present disclosure provides a method for bonding an electronic component and a method for manufacturing a bonded body, which are capable of sintering a silver paste at a comparatively low temperature.

Disclosed is a method for bonding an electronic component using a silver paste containing silver particles, the method including: applying a silver paste containing silver particles on a surface of a substrate and setting electronic components on the silver paste applied, heating in a reducing atmosphere at a temperature of lower than 300° C., and after heating in the reducing atmosphere, heating in an oxidizing atmosphere at a temperature of 300° C. or lower.

19 Claims, 2 Drawing Sheets

(51) Int. Cl.
      *H05K 3/34*       (2006.01)
      *B23K 35/30*     (2006.01)
      *H05K 3/32*       (2006.01)
      *B23K 35/38*     (2006.01)
      *B23K 35/36*     (2006.01)

(56) References Cited

U.S. PATENT DOCUMENTS

| | | |
|---|---|---|
| 2012/0097545 A1 | 4/2012 | Imori et al. |
| 2015/0037197 A1* | 2/2015 | Komatsu .................. B22F 3/14 419/45 |
| 2015/0041974 A1 | 2/2015 | Kobayashi et al. |
| 2016/0220955 A1 | 8/2016 | Ozawa |
| 2017/0294397 A1* | 10/2017 | Croteau .................. H01L 24/27 |
| 2018/0342478 A1* | 11/2018 | Nakako .................... H01L 24/32 |

FOREIGN PATENT DOCUMENTS

| | | |
|---|---|---|
| JP | 2007-294355 A | 11/2007 |
| JP | 2009-167491 A | 7/2009 |
| JP | 2010-53377 A | 3/2010 |
| JP | 2011-14556 A | 1/2011 |
| JP | 2011-249257 A | 12/2011 |
| WO | WO 2011/145647 A1 | 11/2011 |
| WO | WO 2013/133085 A1 | 9/2013 |
| WO | WO 2015/045566 A1 | 4/2015 |
| WO | WO 2017/043540 A1 | 3/2017 |
| WO | WO 2017/043541 A1 | 3/2017 |

\* cited by examiner

METHOD FOR BONDING ELECTRONIC COMPONENT AND METHOD FOR MANUFACTURING BONDED BODY

CROSS REFERENCE TO RELATED APPLICATION

This application claims benefit of priority to Japanese Patent Application 2017-182141 filed Sep. 22, 2017, the entire content of which is incorporated herein by reference.

BACKGROUND OF INVENTION

Field of the Invention

The present embodiment relates to a method for bonding an electronic component and a method for manufacturing a bonded body.

Description of the Related Art

It has hitherto been known that a conductive paste prepared by dispersing a metal powder in a dispersion medium is used as a bonding material when a light-emitting element, a power semiconductor element and the like are set on a mounting member in a light-emitting device including a light-emitting element as a light source and a power semiconductor device. Examples of the metal powder used in such conductive paste include powders of metals such as gold, silver, copper or nickel. Of these metals, silver is comparatively inexpensive and has the highest thermal conductivity and has a feature of being sintered at lower temperature as compared with other metals.

JP 2009-167491 A discloses a metal powder used for manufacturing a sintered body by sintering, the metal powder comprising either silver or a silver alloy as a main component and at least either a halogen element or a halide as a ductility improving component, wherein the content of the halogen element in the metal powder is in a range of 5 to 2,000 ppm, and the metal powder has a 50% diameter of 0.5 to 20 µm and a sphericity of 0.5 or more. JP 2009-167491 A also discloses that sintering of this metal powder progresses at a temperature of about 600° C.

SUMMARY OF THE INVENTION

According to one aspect of the present embodiment, there is provided a method for bonding an electronic component using a silver paste containing silver particles, the method including: applying a silver paste containing silver particles on a surface of a substrate and setting an electronic component on the silver paste applied, heating in a reducing atmosphere at a temperature of lower than 300° C., and after heating in the reducing atmosphere, heating in an oxidizing atmosphere at a temperature of 300° C. or lower.

According to another aspect of the present embodiment, there is provided a method for manufacturing a bonded body, the method including: applying a silver paste containing silver particles on a substrate, setting an electronic component on the silver paste, heating the silver paste in a reducing atmosphere at a temperature lower than 300° C., and after heating in the reducing atmosphere, heating in an oxidizing atmosphere at a temperature of 300° C. or lower to form a bonded body.

The present embodiment can provide a method for bonding an electronic component and a method for manufacturing a bonded body, which are capable of bonding with a silver paste at a comparatively low temperature.

BRIEF DESCRIPTION OF THE DRAWINGS

The disclosure will become more fully understood from the following detailed description, taken in conjunction with the accompanying drawings, in which.

DESCRIPTION OF THE EMBODIMENTS

Figure 1:
FIG. 1 is a photograph of a sintered film obtained in Comparative Example 2.

One embodiment of the present disclosure will be described in detail below. The following embodiment illustrates a bonding method and a manufacturing method for embodying a technical idea of the present disclosure, and the present disclosure is not limited to the bonding method and the manufacturing method described below.

A more complete appreciation of the invention and many of the attendant advantages thereof will be readily obtained as the same becomes better understood by reference to the following detailed description when considered in connection with the accompanying drawings.

[Method for Bonding Electronic Component]

A method for bonding an electronic component according to the present embodiment includes applying a silver paste containing silver particles on a surface of a substrate and setting an electronic component on the silver paste applied, heating in a reducing atmosphere at a temperature of lower than 300° C., and after heating in the reducing atmosphere, heating in an oxidizing atmosphere at a temperature of 300° C. or lower.

(Application of Silver Paste and Set of Electronic Component)

First, a silver paste is applied on a surface of a substrate. The method of applying the silver paste is not particularly limited and, for example, it is possible to appropriately employ known methods such as a screen printing method, an offset printing method, an ink-jet printing method, a flexographic printing method, a dispenser printing method, a gravure printing method, a stamping method, a dispensing method, a squeegee printing method, a silk screen printing method, a spraying method, a brush coating method and a coating method. The coating thickness of the silver paste can be appropriately set according to its applications and can be set at, for example, 1 µm to 500 µm, preferably 5 µm to 200 µm, and more preferably 10 µm to 100 µm.

(Silver Paste)

The silver paste contains silver particles. It is preferable that the silver paste contain the silver particles as a main component. The silver paste may be those composed of the silver particles. The content of the silver particles in the silver paste is preferably 70% by mass or more, and more preferably 85% by mass or more. It is possible to decrease voids after heating by controlling the content of the silver particles to 70% by mass or more.

The shape of the silver particles is not particularly limited and may be, for example, either an approximately-spherical shape or a flake shape. As used herein, the fact that the silver particles have an "approximately-spherical shape" means that an aspect ratio (a/b) defined by a ratio between a major axis a and a minor axis b of the silver particles is 2 or less, and the fact that the silver particles have a "flake shape" means that the aspect ratio is more than 2. The major axis a and the minor axis b of the silver particles can be measured by image analysis using SEM.

The silver particles have an average particle diameter of preferably 0.5 µm or more, more preferably 1 µm or more, and still more preferably 2 µm or more. The silver particles have an average particle diameter of preferably 10 µm or less, and more preferably 5 µm or less. If the average particle diameter is 0.5 µm or more, and more preferably 1 µm or more, since the silver particles do not aggregate without forming a protective layer of a capping agent on a surface of the silver particles, it becomes unnecessary to thermally decompose the protective layer, thus making it possible to sinter at a low temperature. Since cavities due to thermal decomposition of the protective layer are not generated, it is also possible to decrease the electric resistance of a sintered body (bonded body). Because of a large particle diameter of the silver particles, the fluidity of the silver paste is improved. Therefore, in the case of having the same fluidity (operability), it becomes possible for the silver paste to contain much more silver particles, whereby, cavities in the sintered body (bonded body) decreases, thus making it possible to further decrease the electric resistance. If the average particle diameter is 10 µm or less, and more preferably 5 µm or less, the specific surface area of the silver particles increases to generate a melting point depression phenomenon, thus making it possible to lower the sintering temperature. The particle diameter of the silver particles can be measured by a laser diffraction method. As used herein, "average particle diameter" means a median diameter on a volume basis measured by the laser diffraction method (at a cumulative volume frequency of 50% determined from particle size distribution).

Preferably, the content of silver particles having a particle diameter of less than 0.3 µm in the silver particles is 5% by mass or less, and more preferably, the content of silver particles having a particle diameter of less than 0.5 µm or less in the silver particles is 15% by mass or less. The silver particles tend to undergo sintering at a lower temperature as the particle diameter decreases. Particularly, nanosized silver particles undergo sintering at a temperature lower than that in the case of microsized silver particles. Therefore, if the content of the nanosized silver particles in the silver paste is large, sintering initiates at a low temperature, so that fusion might occur in a state where the silver particles are not sufficiently brought into contact with each other, leading to formation of a porous bonded body. If the content of silver particles having a particle diameter of less than 0.3 µm is 5% by mass or less, because of a small ratio occupied by silver particles having a small particle diameter in the silver particles present in the silver paste, it is possible to suppress sintering from initiating at a low temperature, thus making it possible to form a bonded body which is dense and has a low resistivity. Similarly, if the content of silver particles having a particle diameter of 0.5 µm or less is 15% by mass or less, because of a small ratio occupied by silver particles having a small particle diameter in the silver particles present in the silver paste, it is possible to suppress sintering from initiating at a low temperature, thus making it possible to form a bonded body which is dense and has a low resistivity.

A trace amount of an oxide layer, a sulfide layer or the like of silver may be present on a surface of the silver particles. Since silver is noble metal, silver particles themselves are less likely to be oxidized and are very stable. However, when looking at a nano-region, silver is likely to adsorb sulfur, oxygen or the like in the air to form a thin layer on a surface of the silver particles. The thickness of the oxide layer, the sulfide layer or the like in the silver particles is preferably 50 nm or less, and more preferably 10 nm or less.

The ratio of the silver oxide in the silver paste is 1.0% by mass or less, preferably 0.5% by mass or less, and more preferably 0.1% by mass or less. Still more preferably, the silver paste does not substantially contain the silver oxide. As used herein, the fact that "silver paste does not substantially contain the silver oxide" means that the silver paste does not contain silver oxide (such as granular silver oxide), except for an oxide layer that can be present on a surface of the silver particles contained in the silver paste. It is possible to decrease the amount of oxygen generated associated with the reduction of the silver oxide by decreasing the ratio of the silver oxide in the silver paste. It is also possible to eliminate the generation of oxygen associated with the reduction of the silver oxide when the silver paste contains no silver oxide. The generation of oxygen associated with the reduction of the silver oxide is extremely dangerous in the sintering step since oxygen is generated in a large amount of 22.4 liters based on 1 mol of the silver oxide. The method according to the present embodiment enables formation of a bonded body in a safer manner by decreasing the amount of oxygen generated, more preferably eliminating the generation of oxygen.

The silver paste may contain, in addition to the silver particles, a dispersion medium. The silver paste may be composed of silver particles and an organic solvent. There is no particular limitation on type of the dispersion medium, and the dispersion medium may be an organic solvent and/or a resin. The resin usable as the dispersion medium is a resin which is decomposed by heating in a reducing atmosphere mentioned later and/or heating in an oxidizing atmosphere mentioned later, and does not remain in the thus formed bonded body. The resin may be, for example, PS (polystyrene) or PMMA (polymethyl methacrylate). It is preferable that the silver paste further contains, as the dispersion medium, an organic solvent. When the organic solvent is contained as a dispersant, the handling property of the silver paste is improved, thus making it easier to uniformly apply the silver paste on a surface of a substrate in a desired thickness. As a result, a uniform bonded body having a desired thickness can be formed. The organic solvent may be, for example, an organic solvent alone, a mixture of two or more organic solvents, or a mixture of diol and ether. It is preferable that the organic solvent has a boiling point in a range of 150 to 250° C. If the boiling point is 150° C. or higher, it is possible to prevent silver paste from drying before the heating step, and air pollution of silver particles and falling off of chips cannot occur. If the boiling point is 250° C. or lower, the evaporation rate in the heating step increases, thus making it possible to accelerate sintering.

The silver paste may contain, in addition to the silver particles and the dispersion medium, a trace amount of additives, such as a dispersant, a surfactant, a viscosity modifier and a diluent solvent. Regarding the content of the additive in the silver paste, the total content of the additive may be 5% by mass or less, e.g. 0.5% by mass to 3% by mass, based on the silver paste.

(Substrate)

The substrate, to which the bonding method according to the present embodiment is applicable, is not particularly limited and may be, for example, wiring boards such as a printed wiring board, lead frames, submounts, copper clad ceramic substrates and the like. Examples of the wiring board include ceramic substrates containing aluminum oxide, aluminum nitride, zirconium oxide, zirconium nitride, titanium oxide, titanium nitride, or a mixture thereof; metal substrates containing Cu, Fe, Ni, Cr, Al, Ag, Au, Ti, or an alloy thereof; glass substrates; resin substrates such as a BT resin substrate; and glass epoxy substrates. The above-mentioned wiring board and lead frame may constitute a part of a package for manufacturing a semiconductor light-emitting device. Examples of the lead frame include those containing Cu, Fe, Ni, Cr, Al, Ag, Au, Ti, or an alloy thereof. When the substrate surface is composed of easily oxidizable metal such as copper, an oxide layer may be formed on the substrate surface and presence of the oxide layer might cause a decrease in bonding strength between the substrate and an electronic component. Meanwhile, in the bonding method according to the present embodiment, heating in a reducing atmosphere is performed in advance of bonding in an oxidizing atmosphere. Heating in a reducing atmosphere causes reduction of the oxide layer on the substrate surface, and the oxide layer is removed. As a result, the bonding strength between the substrate and the electronic component can be improved. Therefore, the bonding method according to the present embodiment is particularly useful when an easily oxidizable substrate is bonded.

(Electronic Component)

An electronic component, to which the bonding method according to the present embodiment is applicable, is not particularly limited and may be, for example, a light-emitting element, a power control element and the like. When the semiconductor light-emitting element is bonded to the package to manufacture the semiconductor light-emitting device, the package may contain a thermoplastic resin having low heat resistance. In this case, the reflectance of the thermoplastic resin might by degraded by heating during bonding, thus degrading properties of the semiconductor light-emitting device. In the bonding method according to the present embodiment, since heating in a reducing atmosphere and heating in an oxidizing atmosphere can be performed at a low temperature, it is possible to suppress degradation of the reflectance of the thermoplastic resin and degradation of properties of the semiconductor light-emitting device caused thereby. Therefore, the bonding method according to the present embodiment is particularly useful when an apparatus including a material having low heat resistance is manufactured.

(Heating in Reducing Atmosphere)

A trace amount of the oxide layer of silver present on a surface of the silver particles is reduced by heating in a reducing atmosphere and, as a result, silver atoms are exposed on the surface of the silver particles. It is considered that surface diffusion of silver atoms is accelerated on the surface of the silver particles when silver atoms are exposed on the surface of the silver particles. Therefore, it is possible to accelerate sintering of the silver particles at a lower temperature in subsequent heating in an oxidizing atmosphere, thus enabling formation of a bonded body having low resistivity. Since silver is noble metal and is very stable as compared with copper or iron, it is possible to make it easier to reduce a trace amount of the silver oxide or silver sulfide present on the surface of the silver particles by controlling to predetermined conditions. It is also possible to further accelerate fusion between silver particles by exposing active silver on the surface of the silver particles.

Heating in a reducing atmosphere and the below-mentioned heating in an oxidizing atmosphere can be performed using a known apparatus such as a firing furnace. Heating in a reducing atmosphere and heating in an oxidizing atmosphere may be performed using different apparatuses or the same apparatus. In the bonding method according to the present embodiment, an apparatus for heating is preferably an apparatus to which both a system for introducing a reducing gas and a system for introducing an oxidizing gas are connected. It is possible to continuously perform heating in a reducing atmosphere and heating in an oxidizing atmosphere in the same apparatus by using such apparatus. When heating in a reducing atmosphere and heating in an oxidizing atmosphere are performed in different apparatuses, the temperature may decrease during moving to another apparatus after heating in a reducing atmosphere. Silver tends to be easily oxidized as the temperature becomes lower. Therefore, when the temperature decreases during movement, an oxide layer might be formed again on the surface of silver from which the oxide layer has been removed by heating in a reducing atmosphere. Therefore, it is preferable that heating in a reducing atmosphere and heating in an oxidizing atmosphere are performed in the same apparatus.

When using the apparatus to which both a system for introducing a reducing gas and a system for introducing an oxidizing gas are connected, it is preferable to prevent the temperature from lowering by holding the temperature in the apparatus during changing an atmospheric gas into an oxidizing gas from a reducing gas. When using the apparatus to which both a system for introducing a reducing gas and a system for introducing an oxidizing gas are connected, it is preferable that the apparatus is equipped with an exhaust system of the reducing gas. Formic acid or hydrogen used as the reducing gas reacts with oxygen present in an oxidizing atmosphere to form water, and water causes a problem such as corrosion (rest) of the apparatus. Hydrogen also involves the risk of reacting with oxygen to cause explosion. When the apparatus is equipped with the exhaust system of the reducing gas, it is possible to prevent corrosion and explosion.

(Reducing Atmosphere)

The reducing atmosphere is preferably a formic acid-containing atmosphere or a hydrogen-containing atmosphere and is preferably, for example, an atmosphere prepared by mixing an inert gas such as nitrogen with formic acid or hydrogen. More preferably, the reducing atmosphere contains formic acid and is preferably, for example, an atmosphere prepared by mixing an inert gas such as nitrogen with formic acid. It is possible to improve safety of the bonding method according to the present embodiment by using a formic acid-containing atmosphere as the reducing atmosphere, thus enabling equipment cost reduction. More preferably, the reducing atmosphere is a nitrogen atmosphere containing 0.5 to 20% by volume of formic acid. If the concentration of formic acid is 0.5% by volume or more, the reducing effect due to formic acid can be enhanced. If the concentration of formic acid is 20% by volume or less, sufficient reducing effect can be obtained and the risk of the gas can be decreased.

(Heating Temperature)

Heating in a reducing atmosphere is performed at a temperature lower than 300° C. Thermal stress during cooling after heating can be decreased by decreasing the temperature of heating in a reducing atmosphere to a low temperature lower than 300° C., thus making it possible to suppress the occurrence of cracking. When the electronic component includes a member having low heat resistance, degradation of the member having low heat resistance can be suppressed. For example, in the case of a semiconductor light-emitting device including a thermoplastic resin having low heat resistance, degradation of the reflectance of the thermoplastic resin can be prevented. The heating temperature in a reducing atmosphere is preferably 280° C. or lower, more preferably 260° C. or lower, and still more preferably 200° C. or lower. The heating temperature in a reducing atmosphere is preferably 150° C. or higher, more preferably 160° C. or higher, and still more preferably 180° C. or higher. If the heating temperature is 150° C. or higher, more preferably 160° C. or higher, and still more preferably 180° C. or higher, it is possible to increase the reaction rate of the reduction reaction of the oxide layer present on the surface of the silver particles. When the silver paste contains an organic solvent, the heating temperature in a reducing atmosphere may be a temperature lower than a boiling point of the organic solvent. The organic solvent gradually evaporates even at room temperature and the evaporation rate increases as the temperature becomes higher. Therefore, when heating is performed, evaporation of the organic solvents progresses as the temperature rises from room temperature and, even if the boiling point is higher than the heating temperature, the solvent usually evaporates completely before the temperature reaches the heating temperature. Even if the organic solvent slightly remains on the substrate when the temperature reaches the heating temperature, the solvent completely evaporates during heating. Therefore, after completion of heating in a reducing atmosphere, the organic solvent in a liquid state is not substantially present on the substrate.

The heating temperature in a reducing atmosphere and the heating temperature in an oxidizing atmosphere may be the same temperature or may be different with each other. The temperature at which heating is performed in a reducing atmosphere is preferably equal to or lower than the temperature at which subsequent heating is performed in an oxidizing atmosphere. If the heating temperature in a reducing atmosphere is equal to or lower than the heating temperature in an oxidizing atmosphere, thermal degradation of peripheral members can be suppressed.

The pressure, under which heating in a reducing atmosphere is performed, is not particularly limited and may be, for example, an atmospheric pressure.

(Heating in Oxidizing Atmosphere)

Next, heating in an oxidizing atmosphere is performed. As mentioned in detail below, the bonding method according to the present embodiment enables the progress of sintering of silver particles under conditions at a temperature lower than that in a conventional method, and makes it possible to form a bonded body having low resistance value by fusing the silver particles to each other.

(Oxidizing Atmosphere)

The oxidizing atmosphere is preferably an oxygen-containing atmosphere, and more preferably an air atmosphere. When the oxidizing atmosphere is the oxygen-containing atmosphere, the oxygen concentration in the atmosphere is preferably 2 to 21% by volume. It is considered that, as the oxygen concentration in the atmosphere becomes higher, surface diffusion of silver atoms is accelerated on the surface of the silver particles, and thus the silver particles are easily fused to each other. As a result, a bonded body having lower resistivity can be formed. If the oxygen concentration is 2% by volume or more, a bonded body having lower resistivity can be formed at a low heating temperature. If the oxygen concentration is 21% by volume or less, it becomes unnecessary for a heating apparatus to be equipped with a pressurization mechanism, thus enabling process cost reduction.

(Heating Temperature)

Heating in an oxidizing atmosphere is performed at 300° C. or lower. It is possible to decrease thermal stress during cooling after heating by setting the heating temperature in an oxidizing atmosphere at a low temperature of 300° C. or lower, thus making it possible to suppress the occurrence of cracking. When the electronic component includes a member having low heat resistance, degradation of the member having low heat resistance can be suppressed. For example, in the case of a semiconductor light-emitting device including a thermoplastic resin having low heat resistance, degradation of the reflectance of the thermoplastic resin can be prevented. The heating temperature in an oxidizing atmosphere is preferably 280° C. or lower, more preferably 260° C. or lower, and still more preferably 200° C. or lower. It has generally been known that silver tends to be sintered at a lower temperature as compared with other metals. However, actually, an oxide layer of silver is present on the surface of the silver particles and this oxide layer interferes with sintering, thus making it difficult to form a bonded body having low resistivity by heating at a low temperature. It is considered that, in the bonding method according to the present embodiment, since the oxide layer on the silver particles surface is reduced by heating in a reducing atmosphere performed before heating in an oxidizing atmosphere to expose silver atoms on the silver surface, surface diffusion of silver atoms is accelerated during the heating in an oxidizing atmosphere. As a result, the silver particles can be sintered at a low temperature. Therefore, it is possible to form a bonded body having low resistivity while suppressing the occurrence of cracking and degradation of a member having low heat resistance by heating in an oxidizing atmosphere at a low temperature of 300° C. or lower, preferably 280° C. or lower, more preferably 260° C. or lower, and still more preferably 200° C. or lower. The heating temperature in an oxidizing atmosphere is preferably 150° C. or higher, and more preferably 160° C. or higher. If the heating temperature is 150° C. or higher, and more preferably 160° C. or higher, a bonded body having lower resistivity can be formed.

It is preferable that the temperature at which heating is performed in an oxidizing atmosphere is equal to or higher than the temperature at which heating is performed in a reducing atmosphere. Thereby, sintering of the silver particles can be accelerated.

The pressure, under which heating is performed in an oxidizing atmosphere, is not particularly limited and may be, for example, an atmospheric pressure.

The bonding method according to the present embodiment may include, in addition to the above-mentioned heating in a reducing atmosphere and heating in an oxidizing atmosphere, one or more optional steps. For example, when the silver paste contains an organic solvent, the organic solvent is preferably evaporated before heating in a reducing atmosphere. By evaporating the organic solvent before heating in a reducing atmosphere, the organic solvent is removed to expose the surface of the silver particles, and the silver particles surface thus exposed can be surely subjected to a reduction treatment with formic acid. When a formic acid-containing atmosphere is used as the reducing atmosphere and the silver paste contains an organic solvent having reactivity with formic acid, the organic solvent may be evaporated by heating before heating in a reducing atmosphere. This heating can be performed in an atmosphere containing no formic acid, e.g., an inert atmosphere such as a nitrogen atmosphere, or an air atmosphere, at 25° C. to 300° C., and preferably 150° C. to 260° C. Evaporation of the organic solvent can be controlled under predetermined heating conditions. When the surface of the substrate is composed of easily oxidizable metal such as copper, heating may be performed in a reducing atmosphere after heating in a reducing atmosphere and subsequent heating in an oxidizing atmosphere. By performing additional heating in a reducing atmosphere, it is possible to reduce the metal, on the substrate surface, oxidized during heating in an oxidizing atmosphere.

In the bonding method according to the present embodiment, the total of the time of heating in a reducing atmosphere and the time of heating in an oxidizing atmosphere is preferably 6 hours or less, more preferably 2 hours or less, and still more preferably 1 hour or less. In the bonding method according to the present embodiment, by performing heating in a reducing atmosphere and subsequent heating in an oxidizing atmosphere, a bonded body having low resistivity can be formed by heating at a low temperature within a short time. As mentioned above, since sufficient sintering can be achieved by heating at a low temperature within a short time, the time required to manufacture the bonded body can be shortened, and the occurrence of cracking and degradation of a member having low heat resistance can be suppressed.

A bonded body having low resistivity and high conductivity can be formed by the bonding method described above. The bonded body formed by the bonding method according to the present embodiment may have a resistivity of 6 μΩ·cm or less, and preferably 4 μΩ·cm or less.

[Method for Manufacturing Bonded Body]

A method for manufacturing a bonded body according to one embodiment of the present disclosure will be described below. With respect to the manufacturing method according to the present embodiment, descriptions on matters common to the above-mentioned method for manufacturing the electronic component are omitted and description is made of only a difference point. Particularly, reference is not sequentially made to the same operation and effect according to the same constitution in the present embodiment.

In the method for manufacturing a bonded body according to the present embodiment, a bonded body is formed by any one of the bonding methods mentioned above.

The method for manufacturing a bonded body includes: applying a silver paste containing silver particles on a surface of a substrate and setting an electronic component on the silver paste, heating the silver paste in a reducing atmosphere at a temperature of lower than 300° C., and after heating in the reducing atmosphere, heating in an oxidizing atmosphere at a temperature of 300° C. or lower to form a bonded body.

The method for manufacturing a bonded body according to the present embodiment may further include, in addition to the above-mentioned heating in a reducing atmosphere and heating in an oxidizing atmosphere, one or more optional steps. For example, when the silver paste contains an organic solvent, the organic solvent is preferably evaporated before heating in a reducing atmosphere. When a formic acid-containing atmosphere is used as the reducing atmosphere and the silver paste contains an organic solvent having reactivity with formic acid, the organic solvent may be evaporated by heating before heating in a reducing atmosphere. When the surface of the substrate is composed of easily oxidizable metal such as copper, heating may be performed in a reducing atmosphere after heating in a reducing atmosphere and subsequent heating in an oxidizing atmosphere.

A bonded body having low resistivity and high conductivity can be manufactured by the manufacturing method according to the present embodiment. The bonded body obtained by the manufacturing method according to the present embodiment may have a resistivity of 6 μΩ·cm or less, and preferably 4 μΩ·cm or less.

EXAMPLES

Example 1

A silver paste was prepared and a bonded body was formed on a substrate in a manner as mentioned below. A glass substrate was used as the substrate.

(Preparation of Silver Paste)

2-Ethyl-1,3-hexanediol (32.4 g) and diethylene glycol monobutyl ether (8.1 g), which are organic solvents, were stirred using a planetary centrifugal mixer (trade name: "Awatori Rentaro AR-500", manufactured by THINKY CORPORATION) for 30 seconds to obtain a mixed solvent.

After weighing 459.50 g of flake-shaped silver particles (manufactured by FUKUDA METAL FOIL & POWDER CO., LTD., product name: "AgC-239", flake shape, average particle diameter (median diameter): 2.6 μm, specific surface area: 0.7 $m^2$/g, the content of silver particles having a particle diameter of less than 0.3 μm: 2% by mass, the content of silver particles having a particle diameter of 0.5 μm or less: 6% by mass), the flake-shaped silver particles were added to the mixed solvent to obtain a mixture. This mixture was stirred using a planetary centrifugal mixer to obtain 500 g of a silver paste. The mixture was stirred by performing a cycle of stirring for 3 minutes and subsequent defoaming for 2 minutes once. The content of the silver particles in the silver paste was 91.9% by mass.

(Temperature Raising Step)

The silver paste thus obtained was applied on a glass substrate having a thickness of 1 mm by a screen printing method. The coating thickness was 100 μm. The glass substrate coated with the silver paste was heated in an air atmosphere from room temperature to 200° C. at a temperature rise rate of 170° C./minute using a batch-wise heating mechanism, and then held at 200° C. for 1 minute.

(First Heating Step)

After changing the atmosphere inside the furnace to a nitrogen atmosphere containing 3% by volume of formic acid (hereinafter referred to as the "formic acid atmosphere"), a first heating step was performed by holding the temperature inside the furnace at 200° C. for 4 minutes. In the present Example, the first heating step corresponds to heating in a reducing atmosphere.

(Second Heating Step)

After changing the atmosphere inside the furnace to an air atmosphere, a second heating step was performed by holding the temperature inside the furnace at 200° C. for 10 minutes. In the present Example, the second heating step corresponds to heating in an oxidizing atmosphere.

Thereafter, the temperature inside the furnace was cooled to 40° C. or lower and then a glass substrate including a sintered film (bonded body) formed on a surface was taken out. The sintered film had a thickness of about 100 μm.

Example 2

In the same manner as in Example 1, except that the temperature of the entire steps was changed to 180° C., the operation of Example 2 was performed to obtain a sintered film having a thickness of about 100 μm.

Example 3

In the same manner as in Example 1, except that the temperature of the entire steps was changed to 150° C., the operation of Example 3 was performed to obtain a sintered film having a thickness of about 100 μm.

Comparative Example 1

In the same manner as in Example 1, except that the atmosphere in the first heating step was changed to an air atmosphere, the operation of Comparative Example 1 was performed to obtain a sintered film having a thickness of about 100 μm.

Comparative Example 2

In the same manner as in Example 1, except that the atmosphere in the temperature rising step and the second heating step was changed to a formic acid atmosphere, the operation of Comparative Example 2 was performed to obtain a sintered film having a thickness of about 100 μm.

Comparative Example 3

In the same manner as in Example 1, except that the atmosphere in the first heating step was changed to an air atmosphere and the atmosphere in the second heating step was changed to a formic acid atmosphere, the operation of Comparative Example 3 was performed to obtain a sintered film having a thickness of about 100 μm.

Comparative Example 4

In the same manner as in Comparative Example 1, except that the temperature of the entire steps was changed to 180° C., the operation of Comparative Example 4 was performed to obtain a sintered film having a thickness of about 100 μm.

Comparative Example 5

In the same manner as in Comparative Example 1, except that the temperature of the entire steps was changed to 150° C., the operation of Comparative Example 5 was performed to obtain a sintered film having a thickness of about 100 μm.

Figure 2:
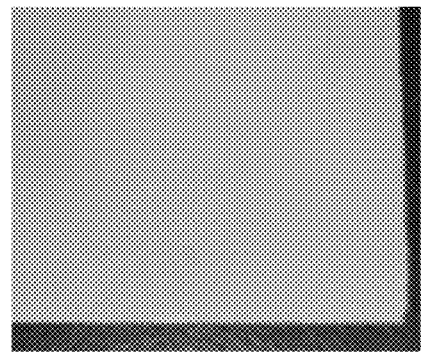
FIG. 2 is a photograph of a sintered film obtained in Example 1.
Figure 3:
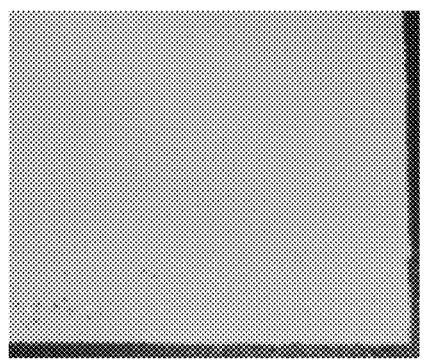
FIG. 3 is a photograph of a sintered film obtained in Example 2.
Figure 4:
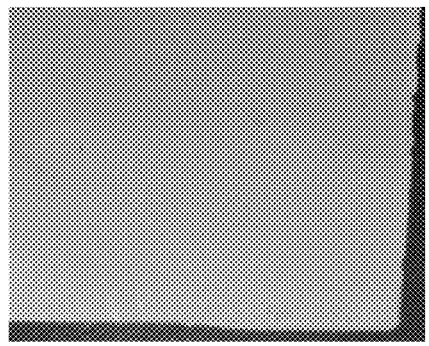
FIG. 4 is a photograph of a sintered film obtained in Example 3.

With respect to each of the sintered films obtained in Examples 1 to 3 and Comparative Examples 1 to 5, appearance was confirmed by visually observing from the glass substrate side. Photographs of the sintered films of Comparative Example 2 and Examples 1 to 3 taken from the glass substrate side are respectively shown in FIGS. 1 to 4 as examples. The results of observation of the appearance are shown in Table 1. With respect to each of the sintered films obtained in Examples 1 to 3 and Comparative Examples 1 to 5, electric resistance was measured by the four-terminal method using a resistivity meter (product name: "MCP-T600", manufactured by Mitsubishi Chemical Corporation). The results are shown in Table 1.

TABLE 1

|  | Example 1 | Example 2 | Example 3 | Comparative Example 1 | Comparative Example 2 | Comparative Example 3 | Comparative Example 4 | Comparative Example 5 |
|---|---|---|---|---|---|---|---|---|
| Temperature (° C.) | 200 | 180 | 150 | 200 | 200 | 200 | 180 | 150 |
| Atmosphere during temperature rising | Atmospheric air | Atmospheric air | Atmospheric air | Atmospheric air | Formic acid | Atmospheric air | Atmospheric air | Atmospheric air |
| Atmosphere during first heating | Formic acid | Formic acid | Formic acid | Atmospheric air | Formic acid | Atmospheric air | Atmospheric air | Atmospheric air |
| Atmosphere during second heating | Atmospheric air | Atmospheric air | Atmospheric air | Atmospheric air | Formic acid | Formic acid | Atmospheric air | Atmospheric air |
| Appearance | Smooth | Smooth | Smooth | Smooth | Bubble generation | Smooth | Smooth | Smooth |
| Electric resistance (μΩ/□) | 118 | 129 | 204 | 145 | 224 | 145 | 608 | 1,538 |
| Resistivity (μΩ · cm) | 3.37 | 3.68 | 5.85 | 4.15 | 6.40 | 4.14 | 18.14 | 46.10 |

In Examples 1 to 3 in which heating in an air atmosphere (oxidizing atmosphere) was performed after heating in a formic acid atmosphere (reducing atmosphere), a sintered film (bonded body) having low resistivity of 6 μΩ·cm or less and smooth surface was obtained. As is apparent from a comparison among Examples 1 to 3, a sintered film having lower resistivity could be obtained as the heating temperature became higher. When comparison is made between Example 1 and Comparative Example 1 in which the temperature conditions are the same, the sintered film obtained in Comparative Example 1 in which only heating in an air atmosphere was performed had higher resistivity than that of sintered film obtained in Example 1 in which both heating in an air atmosphere and heating in a formic acid atmosphere were performed. This reason is considered that sintering of the silver particles did not progress in Comparative Example 1 since the oxide layer on the surface of the silver particles was not reduced. The sintered film obtained in Comparative Example 2 in which only heating in a formic acid atmosphere was performed had higher resistivity than that of sintered film obtained in Example 1 in which both heating in an air atmosphere and heating in a formic acid atmosphere were performed, and that of the sintered film obtained in Comparative Example 1 in which only heating in an air atmosphere was performed. From these results, it is considered that sintering of the silver particles does not easily progress in the formic acid atmosphere since diffusion on the surface of the silver particles is not accelerated by oxygen in the formic acid atmosphere. The generation of bubbles was observed on the surface of the sintered body obtained in Comparative Example 2. This reason is considered that a reaction associated with the generation of a gas occurred between formic acid and the organic solvent contained in the silver paste in the temperature rising step. It is considered that the generation of bubbles was also a reason why an increase in resistance value of the sintered film of Comparative Example 2 occurred. The sintered film obtained in Comparative Example 3 in which heating in a formic acid atmosphere was performed after heating in an air atmosphere had higher resistivity than that of the sintered film obtained in Example 1 in which heating in an air atmosphere was performed after heating in a formic acid atmosphere. This reason is considered that sintering does not progress during heating in an air atmosphere because of the presence of the oxide layer on the surface of the silver particles and the formic acid atmosphere does not have the effect of accelerating sintering of the silver particles during subsequent heating in the formic acid atmosphere in Comparative Example 3.

As is apparent from a comparison between Example 2 and Comparative Example 4 in which the heating temperature was 180° C., and a comparison between Examples 3 and Comparative Example 5 in which the heating temperature was 150° C., a bonded body having lower resistivity could be formed by heating in an air atmosphere after heating in a formic acid atmosphere as compared to that in the case of performing the entire steps in an air atmosphere when the heating temperature is the same.

With respect to each of the sintered films obtained in Examples 1 to 3 and Comparative Examples 1 to 5, surface roughness, levels, minute waviness, and shape were measured to evaluate surface waviness Wa (μm) by use of a contact surface roughness tester (product name: "Alpha-Step IQ3", manufactured by KLA Tencor). The measurements were performed with Gaussian filter as an analysis filter under the conditions of scan length of 2000 μm, scan speed of 50 μm/second, and cutoff value of 80 μm. The results are shown in Table 2.

TABLE 2

| | Example 1 | Example 2 | Example 3 | Comparative Example 1 | Comparative Example 2 | Comparative Example 3 | Comparative Example 4 | Comparative Example 5 |
|---|---|---|---|---|---|---|---|---|
| Wa (μm) | 0.014 | 0.031 | 0.010 | 0.036 | 30 | 0.052 | 0.035 | 0.052 |

Wa value of Comparative Example 2 where bubbles were found by the observation of the appearance described above was quite high of 30 μm. All of the Examples 1 to 3 and Comparative Examples 1 and 3 to 5 were evaluated as smooth by the visual observation of the appearance. However, according to the results in Table 2, Wa values of Examples 1 to 3 were low of 0.031 μm or less, while Wa values of Comparative Examples 1 and 3 to 5 were 0.035 μm or more. From these results, it can be seen that the sintered films (bonded bodies) having smoother surfaces were obtained in Examples 1 to 3 where heating in the air atmosphere (oxidizing atmosphere) was performed after heating in the formic acid atmosphere (reducing atmosphere).

The method for bonding with a sintered silver paste and the bonded body of the present embodiment can be applied, for example, to applications for manufacturing heat-resistant power wirings, component electrodes, die attaches, microbumps, flat panels, solar wirings and the like; applications such as wafer connections, and the manufacture of electronic components manufactured by combination thereof. The method for bonding with a sintered silver paste and the method for manufacturing a bonded body of the present embodiment can be applied in the case of manufacturing light-emitting devices using semiconductor light-emitting elements such as LED and LD.

What is claimed is:
1. A method for bonding an electronic component using a silver paste containing silver particles, the method comprising:
    applying a silver paste containing silver particles on a surface of a substrate and arranging an electronic component on and in contact with the applied silver paste to form a first structure;
    heating the first structure in a reducing atmosphere at a temperature of lower than 300° C. to form a second structure; and
    after heating the first structure in the reducing atmosphere, heating the second structure in an oxidizing atmosphere at a temperature of 300° C. or lower to form a third structure,
    wherein the temperature at which heating is performed in the reducing atmosphere is equal to or lower than the temperature at which heating is performed in the oxidizing atmosphere.
2. The method according to claim 1, wherein the reducing atmosphere contains formic acid or hydrogen.

3. The method according to claim 2, wherein the reducing atmosphere is a nitrogen atmosphere containing 0.5 to 20% by volume of formic acid.

4. The method according to claim 1, wherein the silver particles are flake-shaped.

5. The method according to claim 1, wherein the silver particles have an average particle diameter of 0.5 μm or more.

6. The method according to claim 1, wherein a content of silver particles having a particle diameter of less than 0.3 μm in the silver particles is 5% by mass or less.

7. The method according to claim 1, wherein a content of silver particles having a particle diameter of less than 0.5 μm or less in the silver particles is 15% by mass or less.

8. The method according to claim 1, wherein the silver paste further contains an organic solvent as a dispersion medium.

9. The method according to claim 8, wherein the organic solvent has a boiling point in a range of 150 to 250° C.

10. The method according to claim 8, further comprising evaporating the organic solvent before the heating in the reducing atmosphere is performed.

11. The method according to claim 1, wherein the oxidizing atmosphere is an oxygen-containing atmosphere.

12. The method according to claim 11, wherein the oxidizing atmosphere is an air atmosphere.

13. The method according to claim 1, wherein a content of the silver particles in the silver paste is 70% by mass or more.

14. The method according to claim 1, wherein
the silver particles have an average particle diameter of 0.5 μm or more and 10 μm or less, and
the silver paste content of silver particles having a particle diameter of less than 0.3 μm is 5% by mass or less.

15. The method according to claim 1, wherein
the silver particles have an average particle diameter of 1.0 μm or more and 5 μm or less, and
the silver paste content of silver particles having a particle diameter of less than 0.5 μm is 15% by mass or less.

16. A method for manufacturing a bonded body, the method including:
applying a silver paste containing silver particles on a substrate to form a first structure;
arranging an electronic component on the silver paste to form a second structure;
heating the second structure in a reducing atmosphere at a temperature lower than 300° C. to form a third structure; and
after heating the second structure in the reducing atmosphere, heating the third structure in an oxidizing atmosphere at a temperature of 300° C. or lower to form a bonded body.

17. A method for manufacturing a bonded body, wherein a bonded body is formed by the method for bonding according to claim 1.

18. The method according to claim 16, wherein the reducing atmosphere contains formic acid or hydrogen.

19. The method according to claim 16, wherein the bonded body formed by the method has a resistivity of 6 μΩ·cm or less.

* * * * *